(12) United States Patent
Michel et al.

(10) Patent No.: US 7,532,475 B2
(45) Date of Patent: May 12, 2009

(54) SEMICONDUCTOR CHIP ASSEMBLY WITH FLEXIBLE METAL CANTILEVERS

(75) Inventors: Bruno Michel, Adliswil (CH); Thomas J. Brunschwiler, Thalwil (CH); Ryan J. Linderman, Zurich (CH); Hugo E. Rothuizen, Adliswil (CH); Urs Kloter, Dietikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/394,007

(22) Filed: Mar. 30, 2006

(65) Prior Publication Data

US 2007/0230133 A1    Oct. 4, 2007

(51) Int. Cl.
  *H05K 7/20* (2006.01)
  *F28F 7/00* (2006.01)
  *H01L 23/34* (2006.01)

(52) U.S. Cl. ............. 361/704; 165/80.2; 165/185; 257/707; 257/713; 361/708; 361/717; 361/719; 361/722

(58) Field of Classification Search .............. None
See application file for complete search history.

(56) References Cited

U.S. PATENT DOCUMENTS

| | | | | |
|---|---|---|---|---|
| 4,156,458 A | * | 5/1979 | Chu et al. ................. 165/81 |
| 5,159,531 A | * | 10/1992 | Horvath et al. .............. 361/704 |
| 5,270,902 A | * | 12/1993 | Bellar et al. ................. 361/718 |
| 5,345,107 A | | 9/1994 | Daikoku et al. |
| 5,528,456 A | * | 6/1996 | Takahashi ................... 361/704 |
| 5,650,914 A | * | 7/1997 | DiStefano et al. ........... 361/704 |
| 6,138,748 A | * | 10/2000 | Hamburgen et al. ........ 165/185 |
| 6,411,513 B1 | * | 6/2002 | Bedard ........................ 361/704 |
| 6,462,952 B1 | * | 10/2002 | Ubukata et al. ............. 361/719 |
| 6,604,575 B1 | * | 8/2003 | Degtiarenko ................ 165/185 |
| 6,856,016 B2 | * | 2/2005 | Searls et al. ................ 257/720 |
| 6,913,075 B1 | * | 7/2005 | Knowles et al. ............. 165/185 |
| 6,965,513 B2 | * | 11/2005 | Montgomery et al. ....... 361/687 |
| 7,288,839 B2 | * | 10/2007 | Colgan et al. ............... 257/707 |

OTHER PUBLICATIONS

K.K Sikka et al. "Gap-Reduced Thermal Paste Package Design for Cooling Single Flip-Chip Electronic Modules" 2002 Inter Society Conference on Thermal Phenomena, IEEE 2002.

* cited by examiner

*Primary Examiner*—Gregory D Thompson
(74) *Attorney, Agent, or Firm*—Eustus D. Nelson, Esq.; Stephen C. Kaufman, Esq.; Daryl K. Neff, Esq.

(57) ABSTRACT

A stress release thermal interface is provided for preventing the building up of stress between chip and heat sink surfaces in a multi-chip module (MCM) while maintaining reliable thermal and mechanical contact. The interface achieves enhanced thermal conduction by using flexible, interlocking posts attached to the surfaces of the chip and the heat sink.

17 Claims, 21 Drawing Sheets

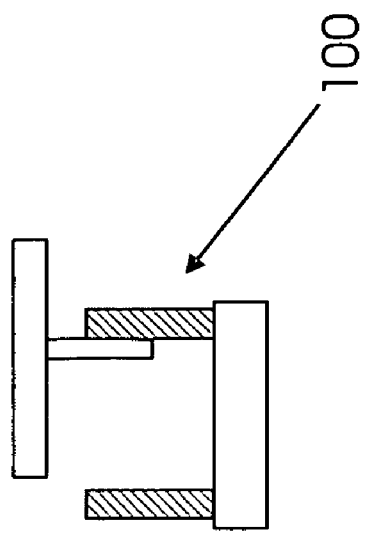
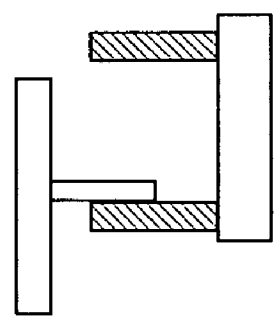
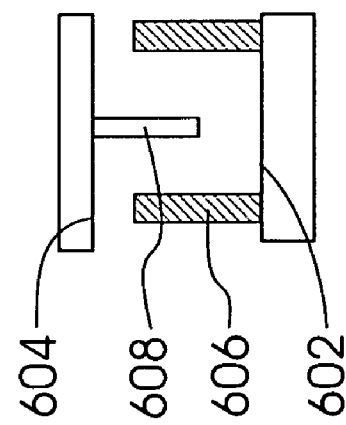
Fig. 6D
Fig. 6C
Fig. 6B

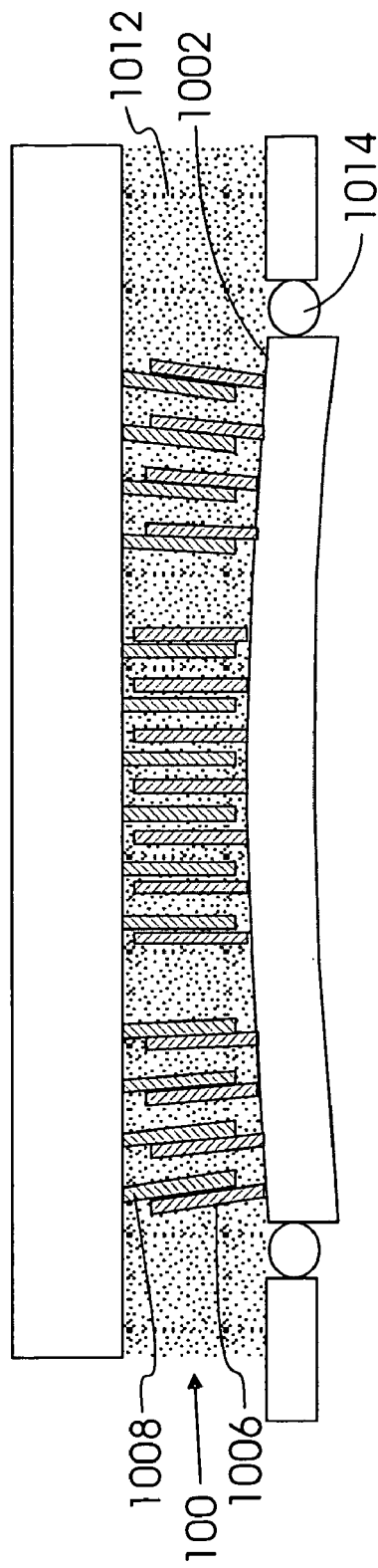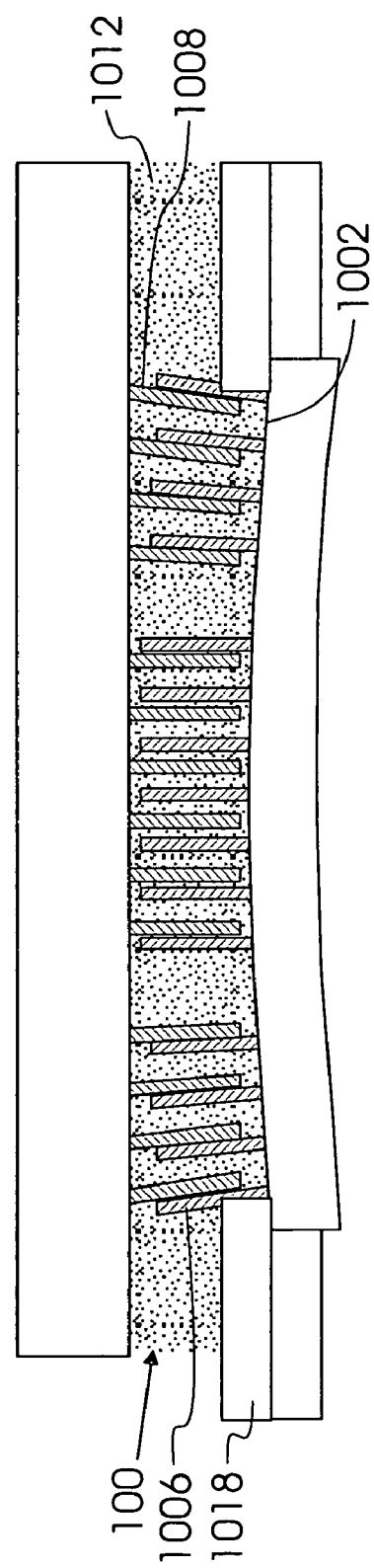

SEMICONDUCTOR CHIP ASSEMBLY WITH FLEXIBLE METAL CANTILEVERS

FIELD OF THE INVENTION

The present invention relates generally to thermal interfaces between a heat generating component and a heat dissipating component. More specifically, the invention relates to a stress releasing thermal interface which enables enhanced thermal conduction between a chip and a heat sink.

BACKGROUND

Electronic components, especially semiconductors components such as transistors and chips are prone to failure or malfunction at high temperatures. The removal of heat from electronic components is a perpetual problem in electronics industry. The electronic component is typically mounted on a thermal dissipation member such as a cold plate or heat sink for heat removal. Cold plates and heat sinks are made of thermally conductive materials that draw heat away from the electronic component to which they are attached. Typically, the thermal coefficient of expansion of the electronic component and the thermal coefficient of expansion of the heat sink are not the same. During a thermal cycle, when the electronic component heats up and subsequently cools down, the difference in thermal coefficient of expansion between the electronic component (chip) and the heat sink causes differential expansion of the surfaces of the chip and the heat sink. This differential expansion may lead to the disengagement of the thermal and mechanical contact of the surfaces or to the fracture of the chip in case of a solid contact. The heat sink cannot provide thermal dissipation if it is not in thermal and mechanical contact with the surface of the chip. One approach for avoiding such disengagement is to glue or solder the surfaces together, but this may lead to the buildup of high stresses in the interface between the surfaces. Another approach for preventing stress buildup in the interface involves using a thick layer of thermal paste. A thick layer of thermal paste placed between the surfaces allows for relative movements of the surfaces of the chip and the heat sink. For example, a thermal paste about 75 microns thick provides lateral and vertical movement of more than 10 microns between the surfaces. However, the thermal resistance of the interface scales with the thickness of the thermal paste between the surfaces. This thermal resistance component is typically the dominant resistance on the path from the electronic component to the heat sink in most single chip and multi-chip modules (with other thermal resistance components being conductive thermal resistance of the chip, spreading resistance of any thermal spreader and convective thermal resistance of a cold plate or a heat sink). For example, the use of thermal paste of thickness 75 microns and a bulk thermal resistance of ~3.5 W/mK will introduce a thermal resistance of about 0.2 Kcm$^2$/W. If the thermal resistance is too high, then the interface will not conduct the heat effectively.

Thus, there is a need for a thermal interface that prevents stress buildup between the surfaces of a chip and a heat sink, ensures a reliable thermal and mechanical contact, and minimizes the resistance to thermal conduction.

SUMMARY

The present invention is directed to a stress releasing interface for preventing stress build between chip and heat sink surfaces while maintaining a reliable thermal and mechanical contact.

The stress releasing interface includes a first surface forming the back of a chip, a second surface facing the first surface forming the back of a heat sink and an array of flexible conducting posts attached to at least one of the first surface or the second surface having multiple gaps there-between.

Another embodiment of the invention provides an interface including a first surface having a first array of cantilevers or posts and a second surface having a second array of cantilevers. The second array of cantilevers is interdigitated with the first array of cantilevers to define multiple gaps in the interface. The cantilevers are substantially flexible to allow freedom of relative lateral and vertical movements between the first surface and the second surface. The gaps between the cantilevers may be filled with a conducting thermal paste or any other thermally conductive fluid.

The interlocked cantilevers on the first and second surfaces may be arranged in a circular symmetry around the center of the surfaces. The first and second surface may have rotational freedom around the center of the surfaces.

In an aspect of the present invention, posts on the chip and heat sink surfaces provide freedom of relative lateral and vertical movement between the surfaces. The posts bend in response to the differential expansion of the surfaces so that contact between the surfaces is maintained.

In another aspect of the present invention, heat conduction is improved throughout the interface by enlarging the overall area between chip and heat sink surfaces available for heat conduction. An embodiment of the invention includes an array of posts attached to the first surface, where the array of posts is interdigitated with another array of posts attached to the second surface. Differential expansion of the surfaces causes relative movement of posts, leading to lateral contact between the posts. This creates preferential paths for heat conduction thereby reducing the resistance due to thermal paste.

In a further aspect of the present invention heat conduction from the chip to the heat sink as well as convective heat transfer between the cantilevers and a cooling fluid is improved. This allows a lateral transport of the cooling fluid and spreading of the heat with an effective thermal resistance much lower than that of solid copper. These and other features, aspects and advantages of the present invention will become better understood with reference to the following description and appended claims.

BRIEF DESCRIPTION OF DRAWINGS

FIGS. 6B, 6C and 6D show the local relative position of cantilevers during a thermal cycle for the embodiment described in the FIG. 6A.

FIG. 10C shows another embodiment of the invention where interface is immersed in the cooling fluid and requires a seal to prevent loss of cooling fluid.

FIG. 10D shows another embodiment of the invention where thin metal foil is bonded to the chip with a hermetic seal to prevent loss of cooling fluid.

DETAILED DESCRIPTION

The invention provides a stress release thermal interface that enables enhanced thermal conduction between a chip and a heat sink. The invention achieves enhanced thermal conduction by using an array of posts attached to the surfaces of the chip and the heat sink.

Figure 1A:
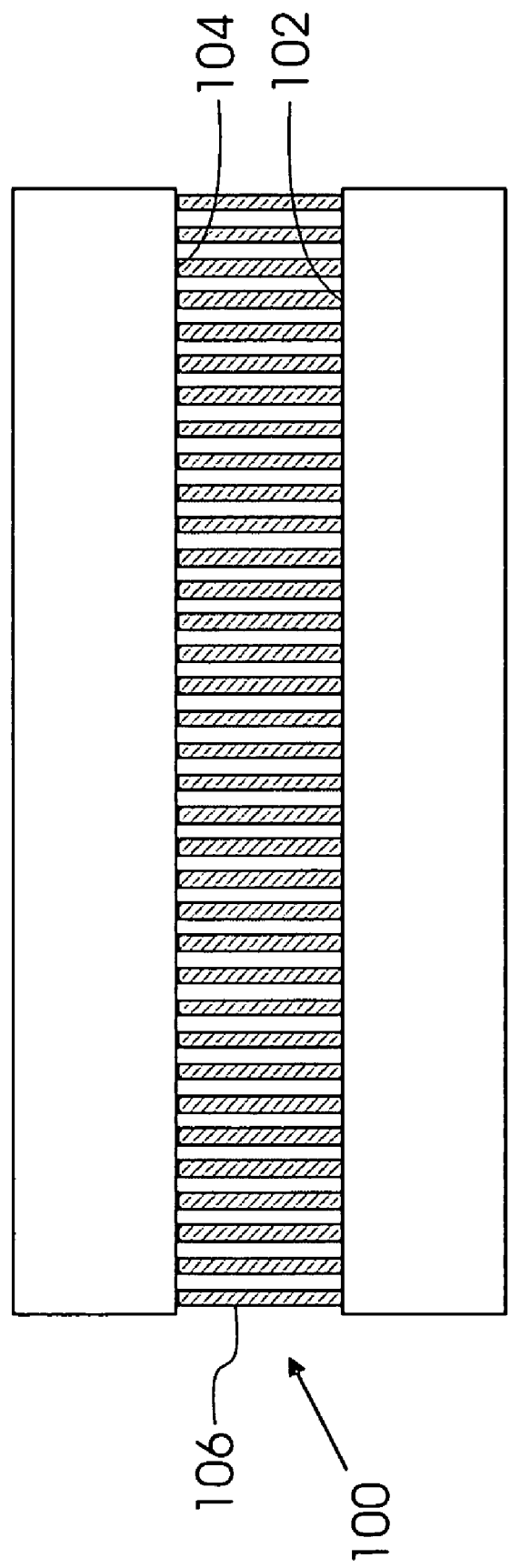
FIG. 1A shows a stress releasing interface in accordance with an embodiment of the present invention.

Referring initially to FIG. 1A, a stress releasing interface 100 comprises a first surface 102, a second surface 104 and an array of posts 106. First surface 102 and second surface 104 face each other to define interface 100. Posts 106 are attached to first surface 102 and second surface 104. Posts 106 are made of flexible material and are closely spaced in the interface, thereby defining multiple gaps therebetween. Posts 106 have a fill factor of between 10% and 50% with the fill factor being the ratio of area occupied by the posts divided by the entire area in a normal projection. Interface 100 further may contain a fluid or non-adhesive thermal paste filled in the gaps between posts 106. In an embodiment of the present invention, first surface 102 is the back surface of a chip and second surface 104 is the back surface of a heat sink.

The thermal coefficient of expansion of second surface 104 is greater than that of first surface 102. As a result of a difference in the thermal coefficient of expansion between the surfaces, one surface will expand more than the other surface during a thermal cycle. This differential expansion can cause problems, as discussed in the background section. Posts 106 provide freedom of relative lateral movements between first surface 102 and second surface 104. This relative lateral movement maintains contact between the chip and the heat sink in case of differential thermal expansion of first surface 102 and second surface 104 relative to each other during a thermal cycle.

Figure 1B:
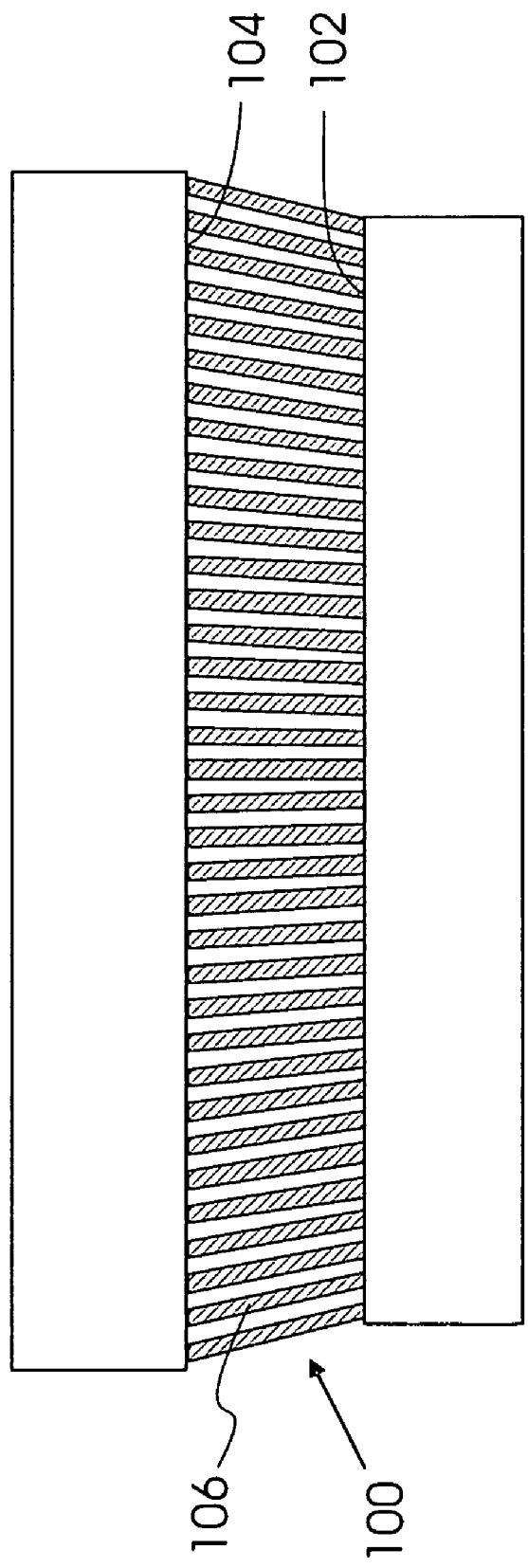
FIG. 1B shows the stress releasing interface described in FIG. 1A, when one surface is laterally expanded relative to the other surface.

FIG. 1B shows interface 100 when second surface 104 has expanded laterally relative to first surface 102. The resulting differential expansion bends posts 106, but the contact between first surface 102 and second surface 104 is maintained.

Figure 2A:
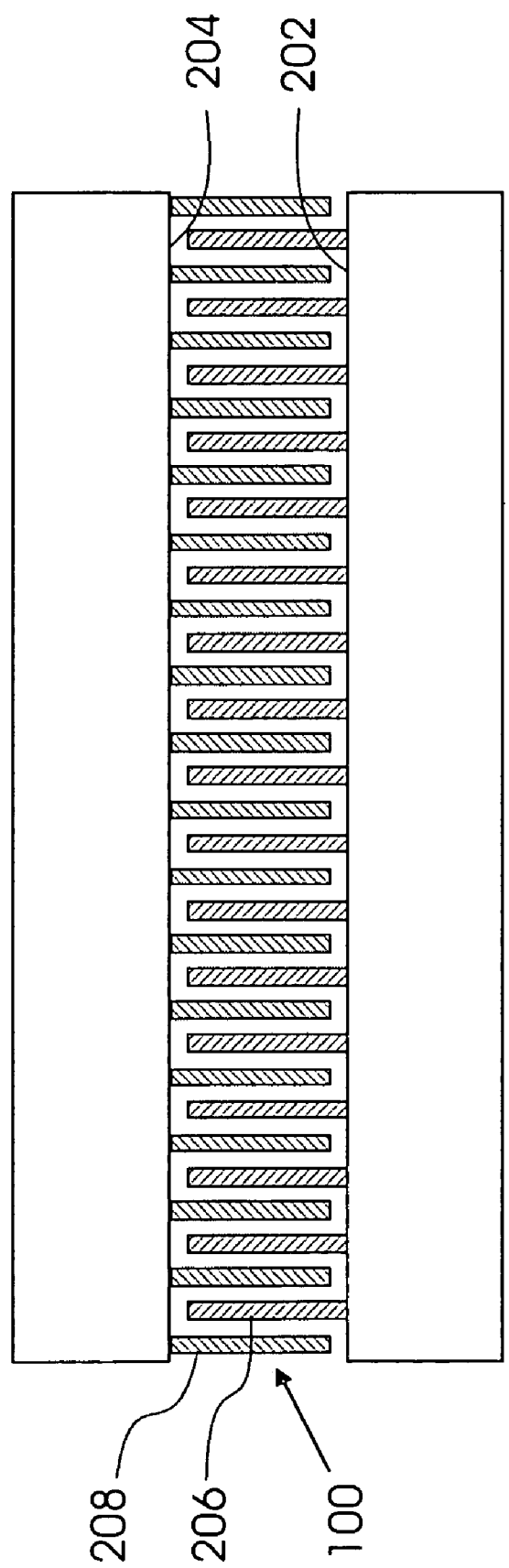
FIG. 2A illustrates a stress releasing interface in accordance with an embodiment of the invention, showing an array of interlocked cantilevers attached to the first and second surfaces.

FIG. 2A illustrates another embodiment of stress releasing interface 100 comprising a first surface 202, a second surface 204, an array of cantilevers 206 attached to first surface 202, and an array of cantilevers 208 attached to second surface 204. Array of cantilevers 206 and array of cantilevers 208 are interdigitated and form a closely spaced interlocking pattern thereby defining multiple gaps in interface 100. Interface 100 further contains a non-adhesive thermal paste filled in the gaps. In one embodiment, first surface 202 is the back surface of a chip and second surface 204 is the back surface of a heat sink. The presence of cantilevers in interface 100 leads to an overall increase in the area available for heat conduction between the chip and the heat sink.

Figure 2B:
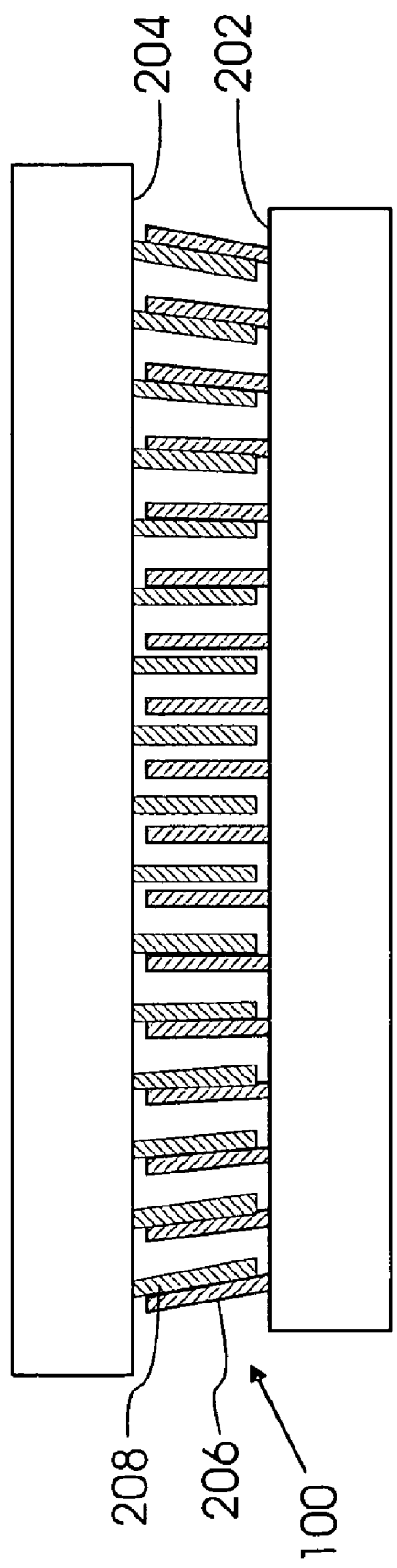
FIG. 2B shows the stress releasing interface described in FIG. 2A, when one surface is laterally expanded relative to the other surface.

FIG. 2B shows interface 100 when second surface 204 has expanded laterally relative to first surface 202. The differential expansion bends array of cantilevers 206 and 208 so that contact between first surface 202 and second surface 204 is maintained. This relative expansion also causes movement of array of cantilevers 206 and array of cantilevers 208 with respect to each other. The bending and movement of the cantilevers is a function of the location of cantilevers. The thermal expansion accumulates over the size of the chip, being zero in the center and reaching a maximum at its periphery. Thus the cantilevers located near the center of first surface 202 bend and move the least while those located near the ends of first surface 202 bend and move the maximum. The movement of cantilevers on the expanded second surface 204 causes the cantilevers on the two surfaces to come closer to each other so that the resistance due to thermal paste between adjacent cantilevers is minimized.

Figure 2C:
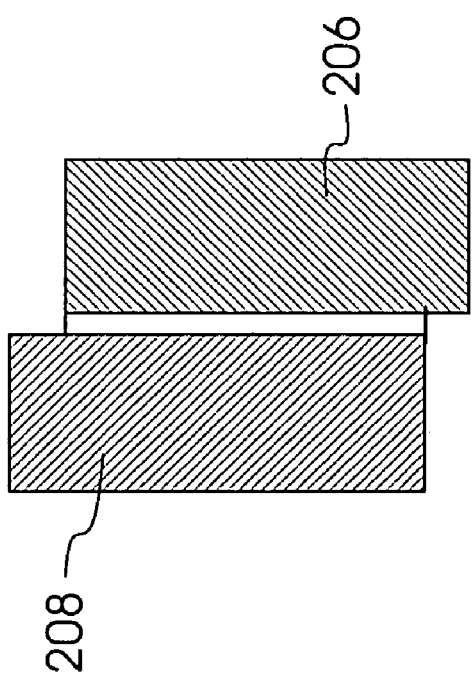
FIGS. 2C and 2D illustrate two limiting cases for the spacing of interlocked cantilevers 206 and 208 in FIG. 2B.
Figure 2D:
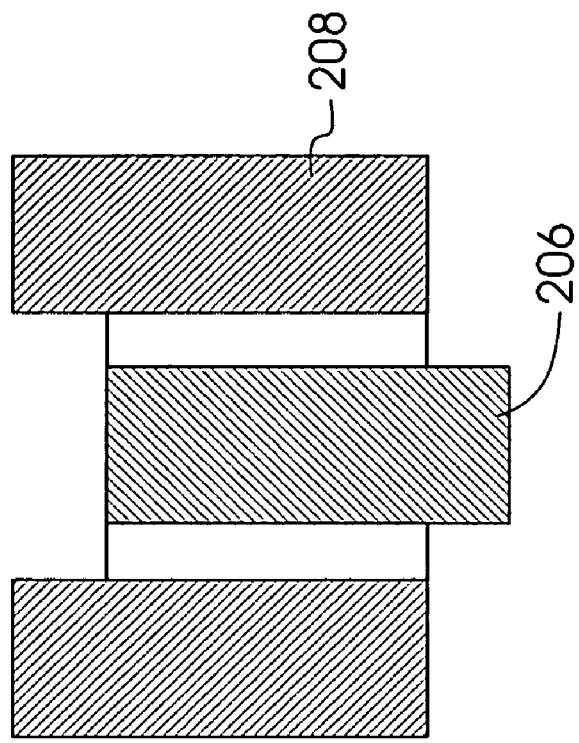

FIGS. 2C and 2D illustrate the two limiting cases for the spacing of interlocked cantilevers 206 and 208 in FIG. 2B. FIG. 2C shows the case when offsetting of cantilevers leads to minimal gap on one side of cantilevers. As shown, the surfaces of cantilevers 206, 208 are facing each other with a minimal gap between them. This arrangement offers minimal resistance, and therefore, preferential heat flow through the interface. FIG. 2D shows the case when cantilever 206 is centered in the gap 210. This arrangement offers two heat flow paths on either side of cantilever 206.

Figure 2E:
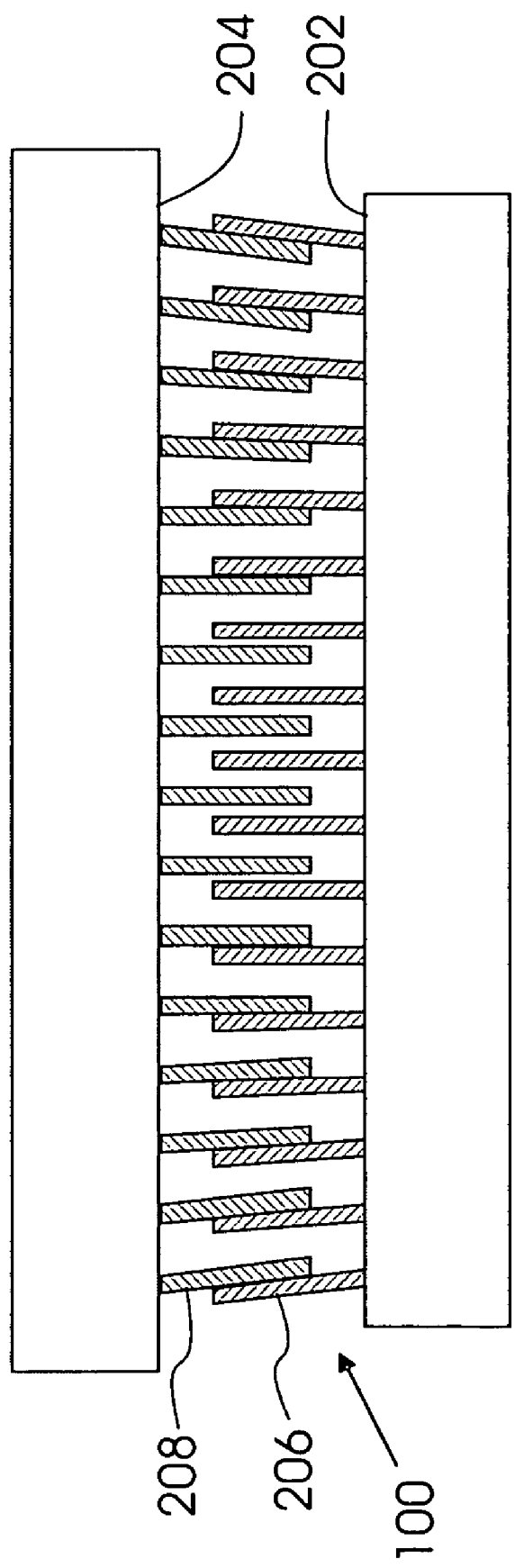
FIG. 2E illustrates the stress releasing interface described in FIG. 2A, when the relative lateral expansion of the surfaces leads to a relative vertical movement of the surfaces.

FIG. 2E shows interface 100 when the differential thermal expansion leads surface 204 to move further apart from first surface 202. The presence of interlocked cantilevers provides freedom for both lateral and vertical movement of second surface 204 with respect to first surface 202 while ensuring good thermal contact between the surfaces in case of differential expansion.

Figure 3:
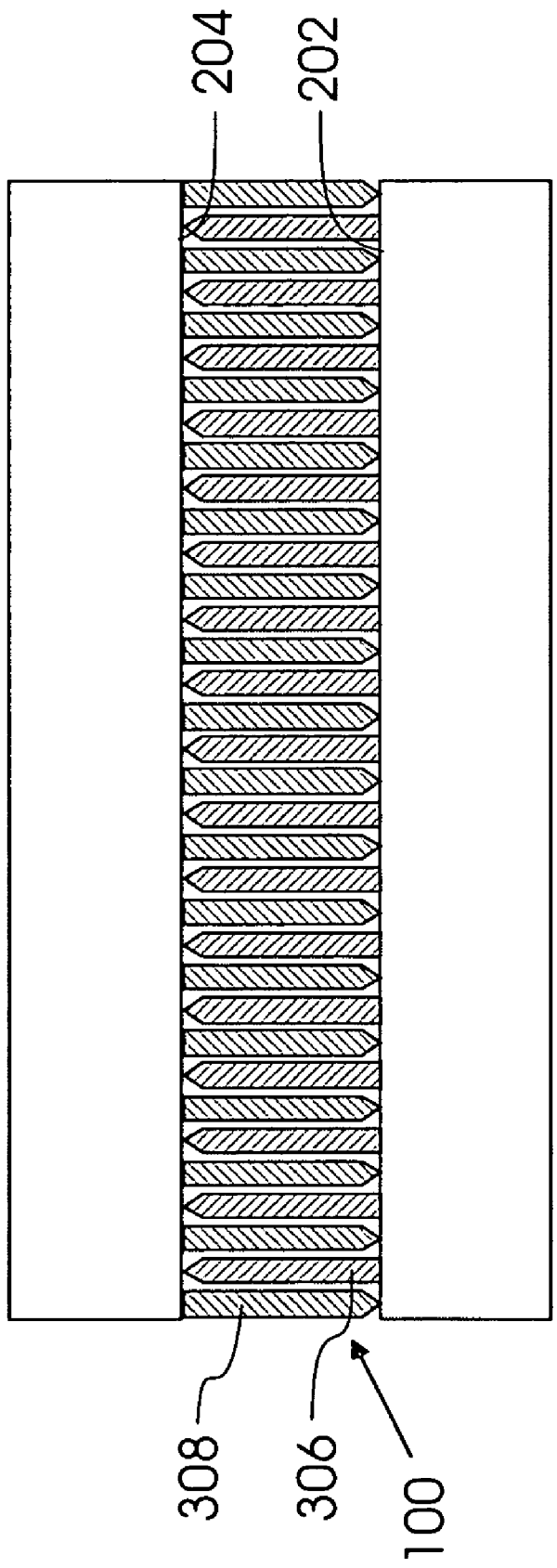
FIG. 3 illustrates a stress release interface in accordance with an alternate embodiment of the present invention, in which interlocking cantilevers have pointed tips.

FIG. 3 illustrates another embodiment of the stress release interface 100 provided by the present invention. The embodiment is similar to FIG. 2A except that the interlocking cantilevers have pointed tips. Pointed tips improve the ease of assembly of the arrays by minimizing the possibility of vertical collision of arrays of cantilevers during assembly.

Figure 4:
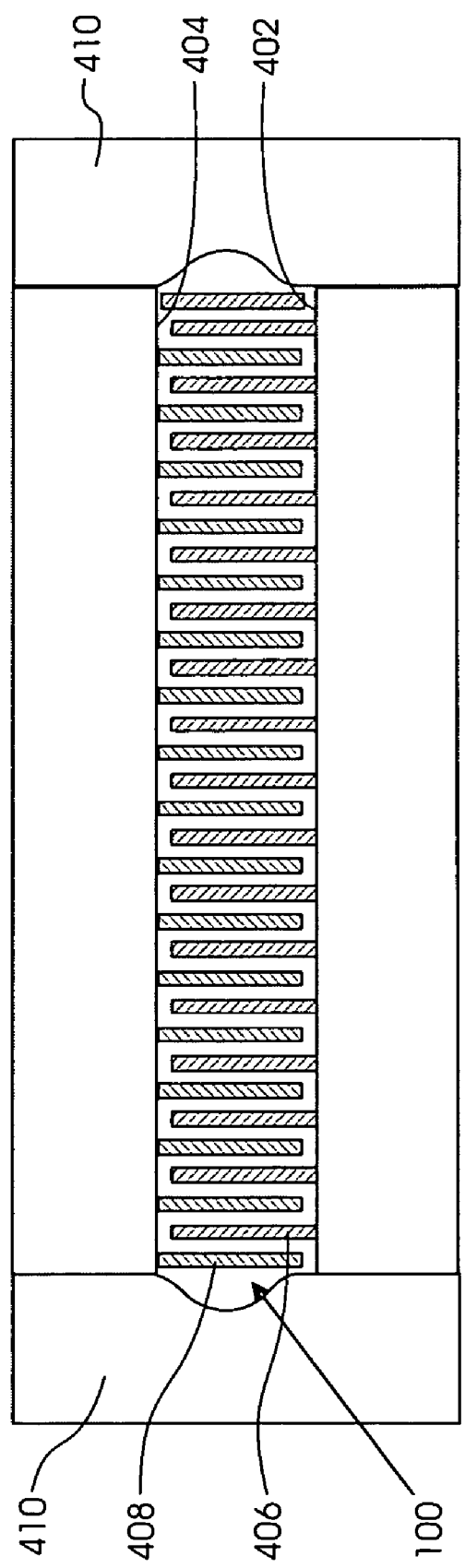
FIG. 4 shows a stress release interface in accordance with an embodiment of the present invention, in which the interface is enclosed in a casing made of an elastic material.

FIG. 4 illustrates another embodiment of stress release interface 100 provided by the present invention. The embodiment is similar to FIG. 2A, but, in addition, the interface is enclosed in a casing 410 made of elastic material. The casing provides an elastic restoring force for moving the thermal paste back into the gaps in the interface. This allows for longer lifetime of the interface during large vertical movements where large amounts of paste may flow in and out of the gaps between cantilevers. e. g., between cantilevers 460 attached to first surface 402 and cantilevers 408 attached to second surfase 404. Casing 410 thus improves the reliability of interface 100 during prolonged thermal cycles.

Figure 5A:
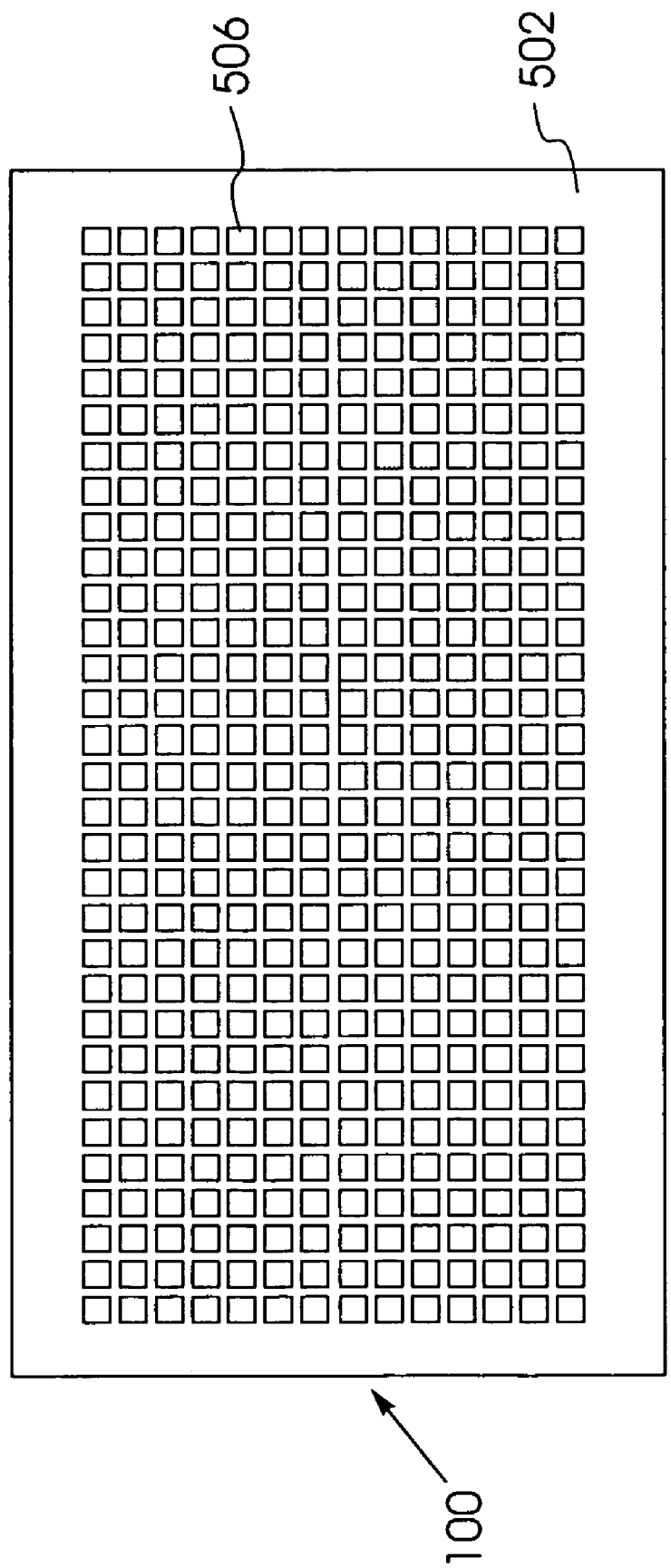
FIG. 5A is a cross-sectional view of a stress release interface in accordance with an embodiment of the present invention.

FIG. 5A illustrates a cross sectional view of interface 100. As shown, chip 502 comprises square cross sections of posts 506 packed tightly in a square lattice with gaps between the posts filled with thermal paste. Square cross sections of posts 506 may represent the cross section of posts as described in FIG. 1A or the cross sections of interlocked cantilevers as described in FIG. 2A.

In an embodiment of the invention, as described in FIG. 1A, posts with a square cross section linearly fill 45% of a repeat unit cell, where a unit cell is a square area with one post located at the center of the square. Area fill factor of posts in unit cell is equivalent to 20.25%.

Consequently, overall number of post is $$N = \text{Chip Area}/(2.2a \times 2.2b)$$

Where a is the width of the post and b is the depth of the post.

For the embodiment described above, the force, $F_{bend}$, applied to bend single post, is the same as shear force, $F_{shear}$, exerted on a respective unit cell area. This force can be calculated as $$F_{bend} = F_{shear} = (dx \times E_{mod} \times b \times a^3)/l_p^3$$

In another embodiment of the invention, as described in FIG. 2, cantilevers with a square cross section linearly fill 90% of the unit cell, where a unit cell is a square with one cantilever located at the center. The area fill factor of cantilevers in a unit cell is equivalent to 81%.

Consequently, overall number of post is $$N = \text{Chip Area}/(1.1a \times 1.1b)$$

Where a is the width of the cantilever and b is the depth of the cantilever.

For the embodiment described above, force, $F_{bend}$ applied to bend single post, is same as shear $F_{shear}$ exerted on respective unit cell area. This can be calculated as $$F_{bend} = F_{shear} = (dx \times E_{mod} \times b \times a^3)/4l_p^3$$

where dx is the displacement, $E_{mod}$ is the Young's modulus of the post and $l_p$ is the length of the post.

The total stress exerted on a chip surface is the product of force required to bend a single post and total number of posts used. Thus, stress on the chip surface scales with the inverse third power of the post length $l_p$ and second power of the width of posts a. As a result, a long and thin post is more suitable for constructing the stress release interface. This explains the use of high aspect ratio posts attached to the surfaces of the chip and the heat sink for improving heat conduction. Such posts may be constructed by deep trench etching of silicon or patterned electro-deposition or other techniques known to those skilled in the art.

In an example embodiment of the present invention, a stress release interface 100 includes a 20 mm square chip, and an array of 300 micron posts fixed to both sides and having width of 20 microns, and a linear fill factor of 45%. In this case, the total number of posts N is 206612. The posts can be made of copper. Copper has a Young's modulus of $12 \times 10^5$ Pa. The force needed to deflect a single copper post by 10 microns is 0.0071 N. Thus, the total force exerted on the chip is 1467 N for a 10 micron overall shear and 367 N for an isotropic expansion where isotropic thermal expansion is a uniform elongation in all directions of space caused by the heating of a surface.

In another embodiment of the present invention, a stress release interface 100 comprises a 20 mm square chip, and an array of 300 micron long cantilevers having widths of 20 micron, and having a linear fill factor of 25%. Therefore the total number of post N is 62500. The force needed to deflect a single copper post by 10 microns is 0.00017 N. Therefore the total force exerted on the chip is 108N for a 10 micron overall shear and 27 N for an isotropic thermal expansion.

Figure 5B:
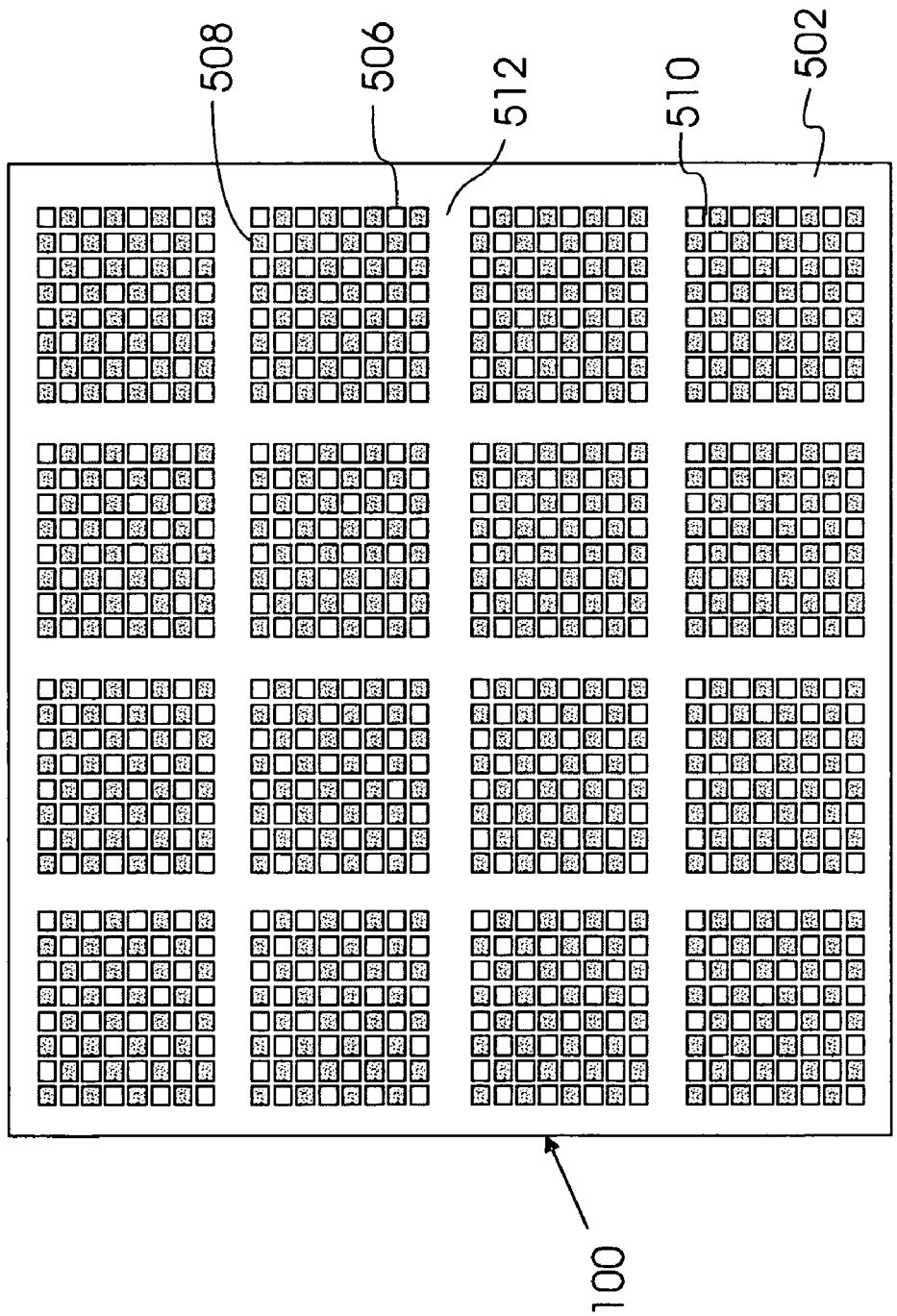
FIG. 5B is a cross-sectional view of a stress release interface in accordance with an embodiment of the present invention, showing interlocked cantilevers arrays including additional nested channels.

FIG. 5B shows a cross sectional view of an embodiment of interface 100 corresponding to FIG. 2A. As shown, chip 502 has a first array of cantilevers 506 interlocked with a second array of cantilevers 508 where the cross sections of interlocked cantilevers form multiple 8×8 repeat units of square lattices. Gaps 510 between the interlocked cantilevers provide channels for movement of the thermal paste. The embodiment further includes additional gaps 512 after every 8×8 repeat unit. The combination of interlocked cantilever arrays with additional nested channels allows for facile movement of the thermal paste during changes in gap width. The facile movement of the thermal paste in interface 100 leads to improved thermal conductivity and improved reliability.

It will be obvious to one skilled in that art that it is not required that the cross section of cantilevers be square shaped as shown in FIGS. 5A and 5B. Alternatively, the cross section may be rectangular, triangular, trapezoidal, hexagonal and octagonal.

Figure 6A:
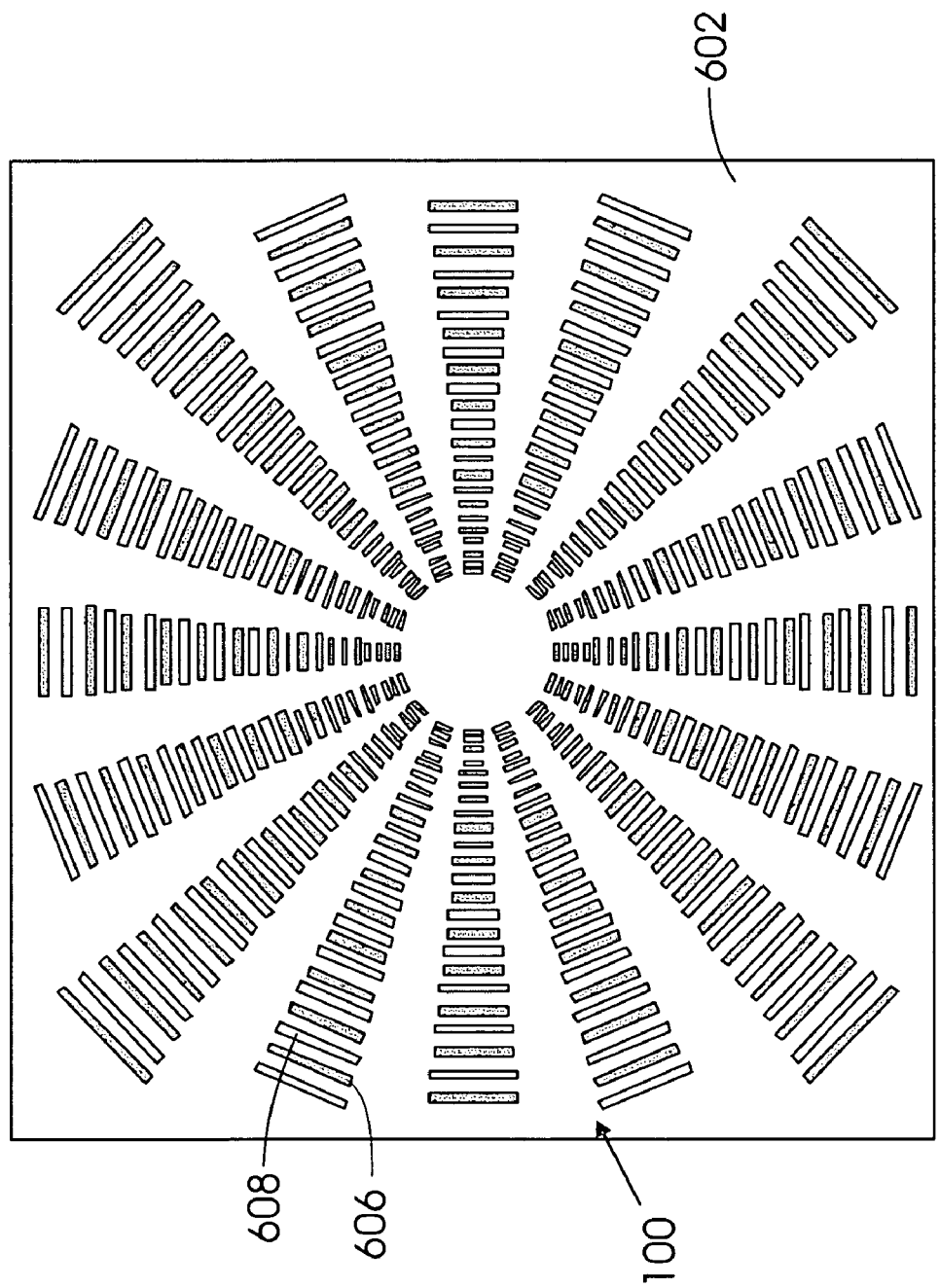
FIG. 6A is a cross sectional view of a stress releasing interface in accordance with an embodiment of the present invention, showing interlocked arrays of rectangular cantilevers arranged with cylindrical symmetry around the center of a chip.

FIG. 6A illustrates a cross sectional view of another embodiment of stress releasing interface 100 provided by the present invention. As seen, chip 602 has interlocked arrays of rectangular cantilevers 606 and 608 with cylindrical symmetry around the center of chip 602. The width of rectangular cantilevers 606 and 608 is aligned along the radial direction. The dimensions of rectangular cantilevers 606 and 608 and the relative spacing may be a function of the radial position of the cantilever. The differential expansion of surfaces of chip 602 and the heat sink (not shown in the Figure) leads to the relative movement of cantilevers 606 and 608. The amplitude of the relative movement of cantilevers 606 and 608 is dependent on the radial position with respect to the center of chip 602. Varying the cross section dimensions of the cantilevers allows adjusting the mechanical compliances while retaining good heat conduction properties with a large contact area between the cantilevers 606 and 608.

FIGS. 6B, 6C and 6D show the local relative position of cantilevers 608 with respect to cantilevers 606 during a thermal cycle for the embodiment described in the FIG. 6A. FIG. 6B shows the interface 100 when there is no differential expansion of first surface 602 and second surface 604. FIG.

6C shows a state where the cantilevers are subject to a temperature near the minimum of the permissible temperature range.

FIG. 6D shows a state where the cantilevers are subject to an optimum maximum temperature within the permissible temperature range for interface 100. Beyond this optimum maximum temperature the posts begin to deform until the maximum temperature is reached where the posts break. Thus, interface 100 maintains good heat conduction for the entire permissible temperature range.

Figure 7A:
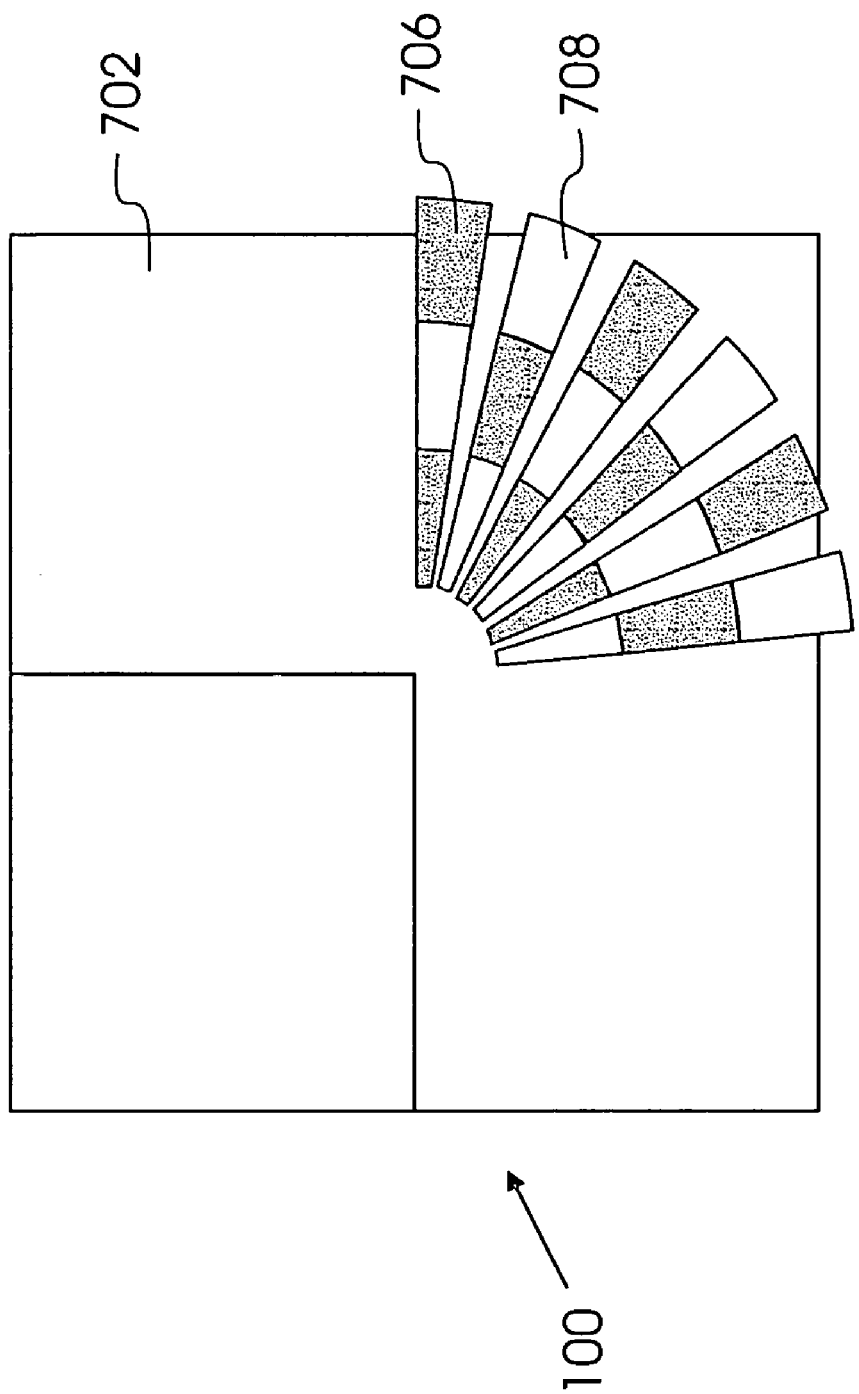
FIG. 7A is a cross-sectional view of a stress release interface in accordance with an embodiment of the present invention, showing an interlocked array of cantilevers in the form of alternating cylindrical section beams.

FIG. 7A illustrates a cross-sectional view of another embodiment of stress release interface 100 provided by the present invention. As shown, chip 702 has an array of cantilevers 706 and similar array of cantilevers 708 attached to the heat sink (not shown in FIG. 7A). Cantilevers 706 and 708 are in the form of alternating cylindrical section beams that are interdigitated and form a closely spaced interlocking pattern with multiple gaps therebetween. The space between the cantilevers is large enough so that array of cantilevers 706 and 708 are not locked during the relative differential expansion of the surfaces at any temperature within the permissible temperature range.

Figure 7B:
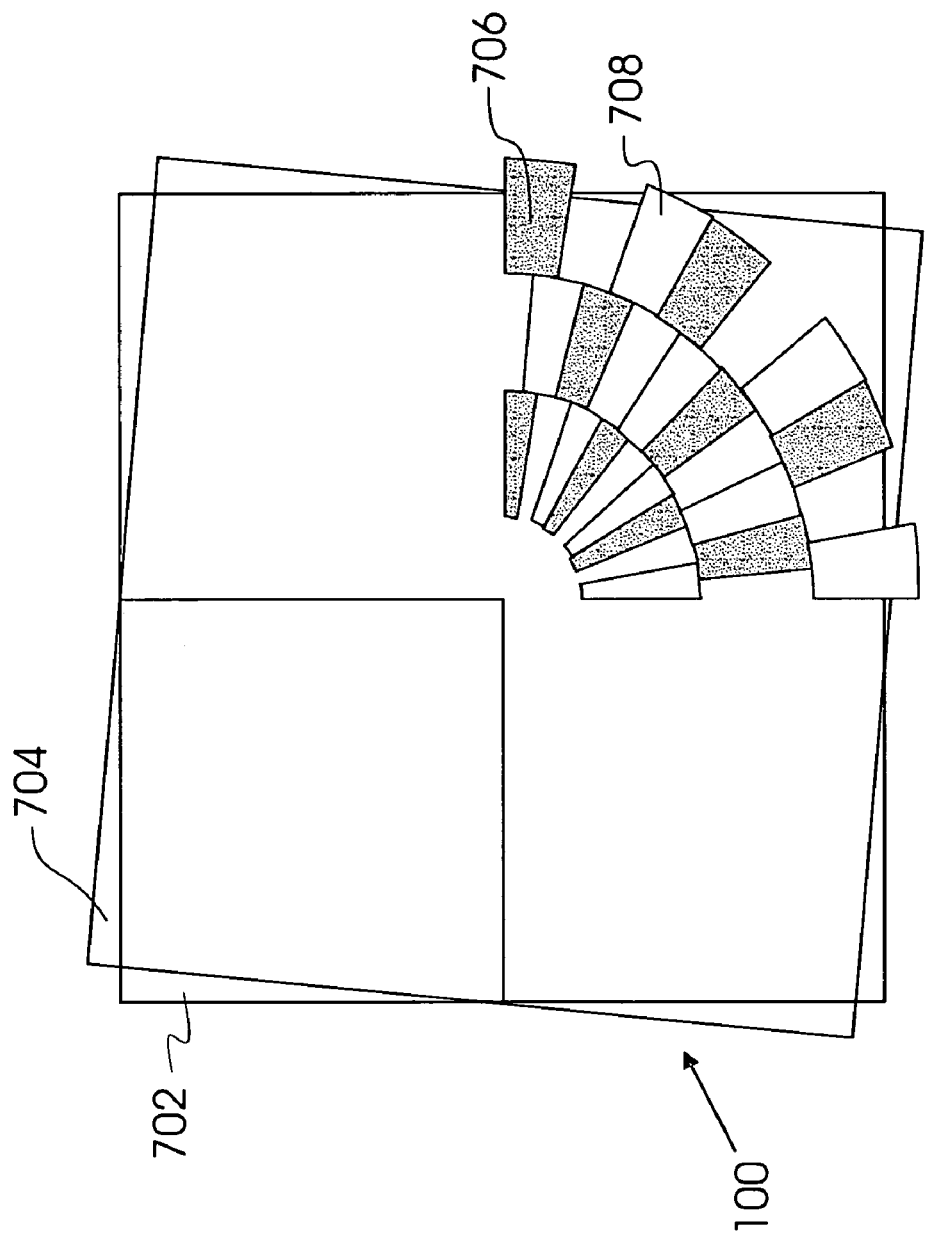
FIG. 7B illustrates the embodiment as shown in FIG. 7A, where the heat sink has been rotated around the center of the chip.

FIG. 7B illustrates the embodiment as shown in FIG. 7A, where heat sink 704 has been rotated around the center of chip 702. This relative rotational movement causes array of cantilevers 706 to come in contact with array of cantilevers 708. The arrays of cantilevers 706 and 708 may maintain contact at various temperatures within the permissible temperature range and do not require differential thermal expansion for maintaining contact. This contact between arrays of cantilevers 706 and 708 lead to enhanced thermal conductivity in interface 100.

Figure 8A:
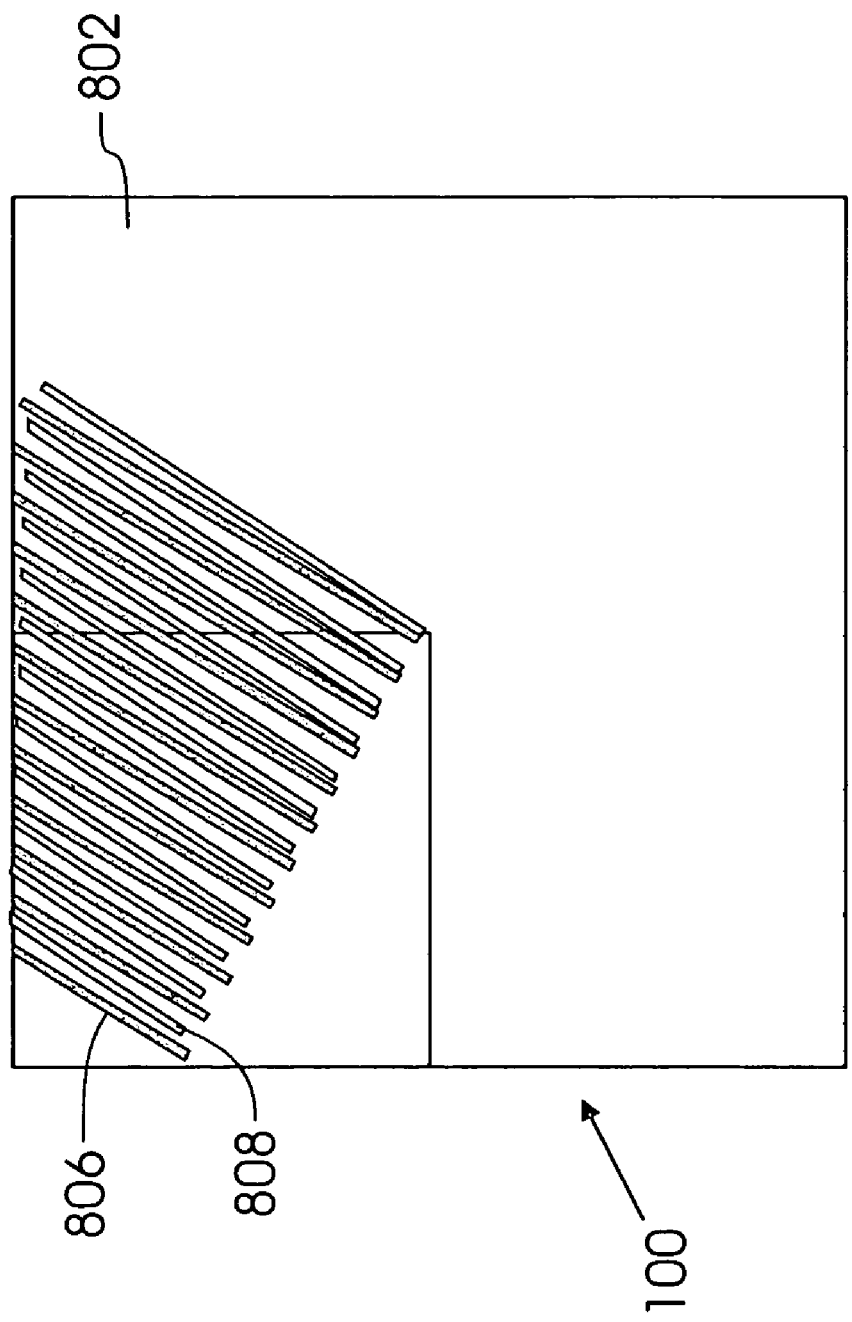
FIG. 8A is a cross-sectional view of another embodiment of stress release interface having groups of interlocked cantilevers with rectangular cross section, where the groups of cantilevers are arranged in a circular symmetry around the center of the chip.

FIG. 8A illustrates a cross-sectional view of another embodiment of stress release interface 100 provided by the present invention. As shown, chip 802 has an array of cantilevers with rectangular cross section. A similar array of cantilevers 808 is attached to the heat sink (not shown in FIG. 8A). Cantilevers 806 and 808 are interdigitated and positioned in groups, where one of the widths of the rectangular cantilever is aligned along the radial direction and the other width touches an edge of chip 802. The groups of cantilevers are arranged in circular symmetry around the center of the chip 802. Spacing between the cantilevers may be adjusted by appropriately selecting the angle between the long rectangular dimension of the cantilevers and the radial direction. The adjustment of spacing ensures the uniformity of contact of cantilevers in the permissible temperature range. The present embodiment combines the aspects of embodiments described in FIG. 2A and FIG. 7A. The contact of the cantilevers in this embodiment can be brought about by using rotational movement (like in FIG. 7A) along with the differential expansion of chip 802 and heat sink (like in FIG. 2A).

Figure 8B:
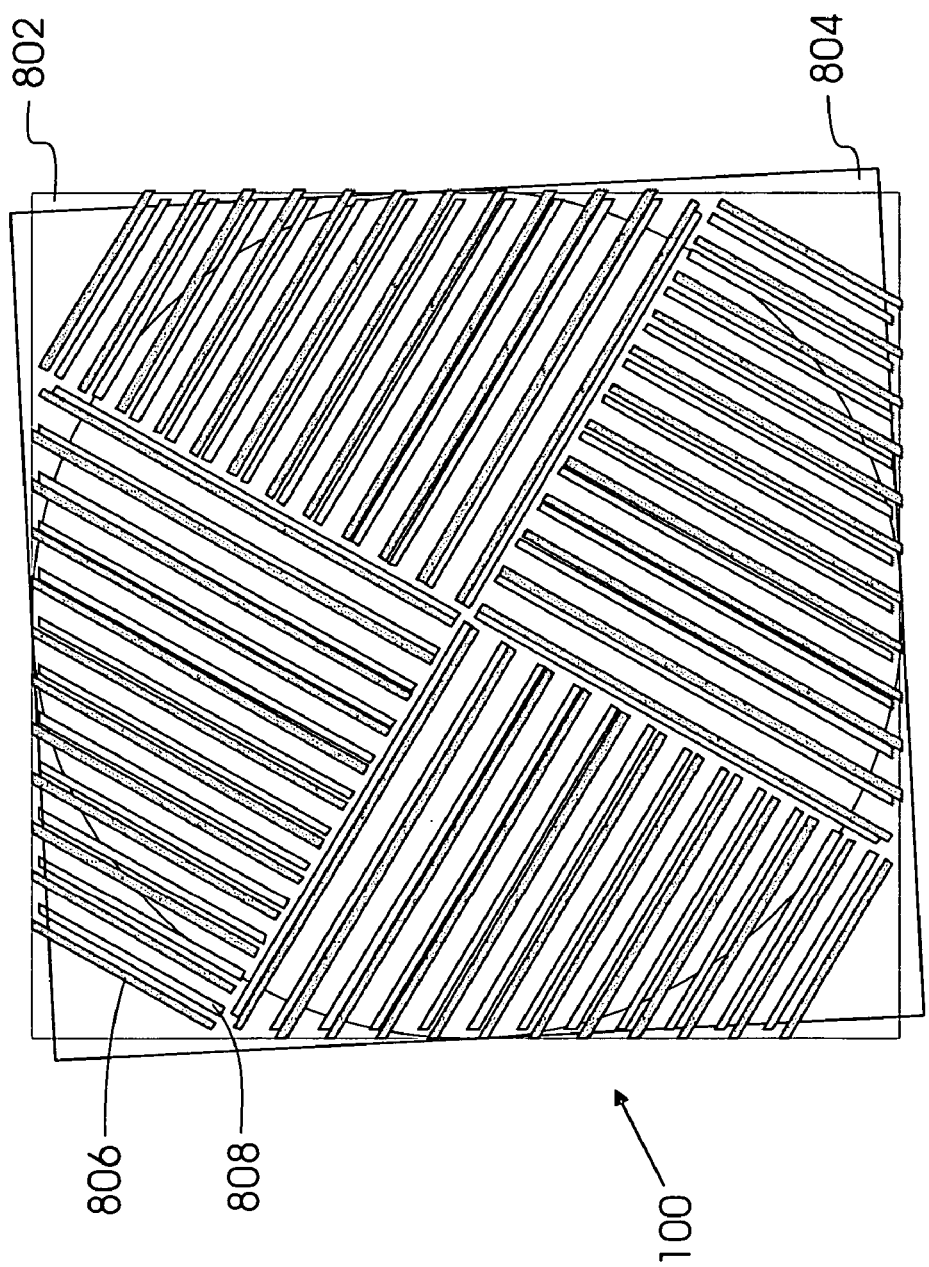
FIG. 8B illustrates the embodiment as shown in FIG. 8A, where the heat sink has been rotated around the center of the chip.

FIG. 8B illustrates the embodiment as shown in FIG. 8A, where heat sink 804 has been rotated around the center of chip 802. This relative rotational movement causes array of cantilevers 806 to align towards the array of cantilevers 808.

Figure 8C:
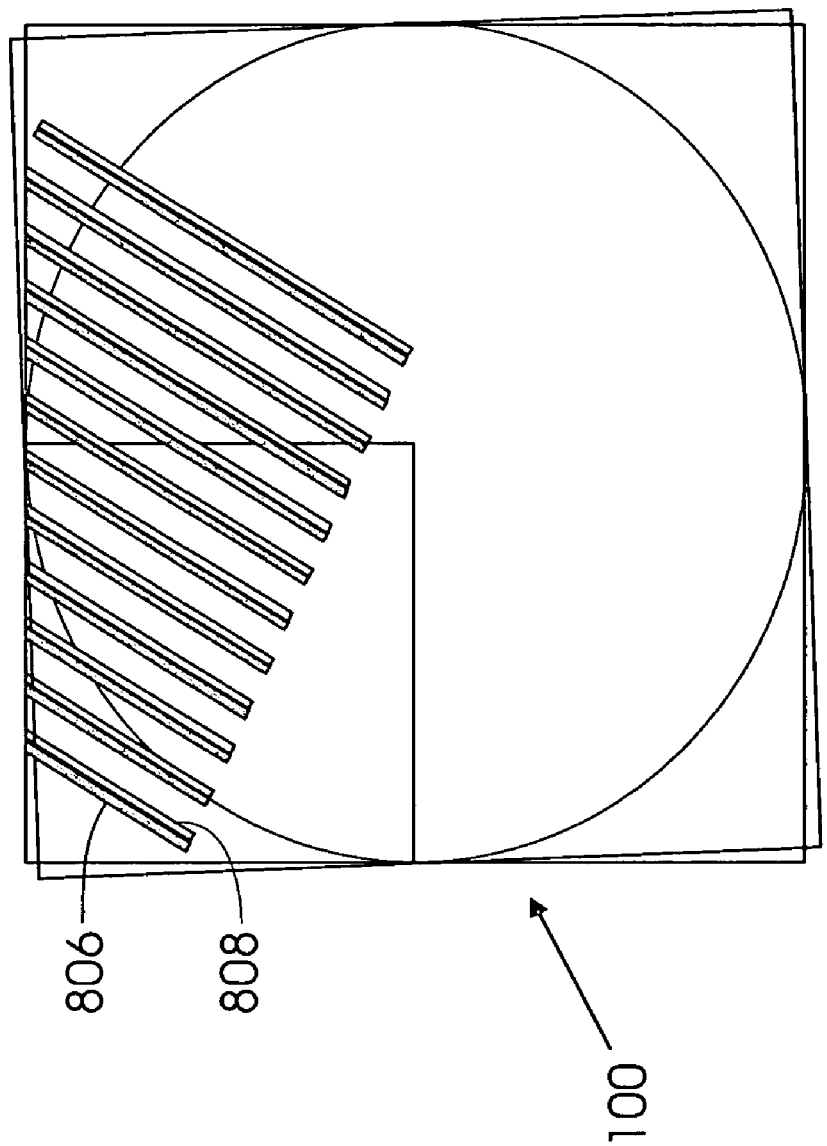
FIG. 8C further illustrates the embodiment as shown in FIG. 8B, where the relative expansion of surfaces of the chip and the heat sink leads to thermal contact between cantilevers.

FIG. 8C further illustrates the embodiment as shown in FIG. 8B, where differential thermal expansion of chip 802 and heat sink 804 causes relative movement of cantilevers 806 and cantilevers 808. The relative movements of cantilevers lead to thermal contact of cantilevers 806 and corresponding cantilevers 808. The embodiment provides that arrays of cantilevers 806 and 808 maintain contact by utilizing both rotational freedom as well as differential thermal expansion of chip and heat sink.

Figure 9:
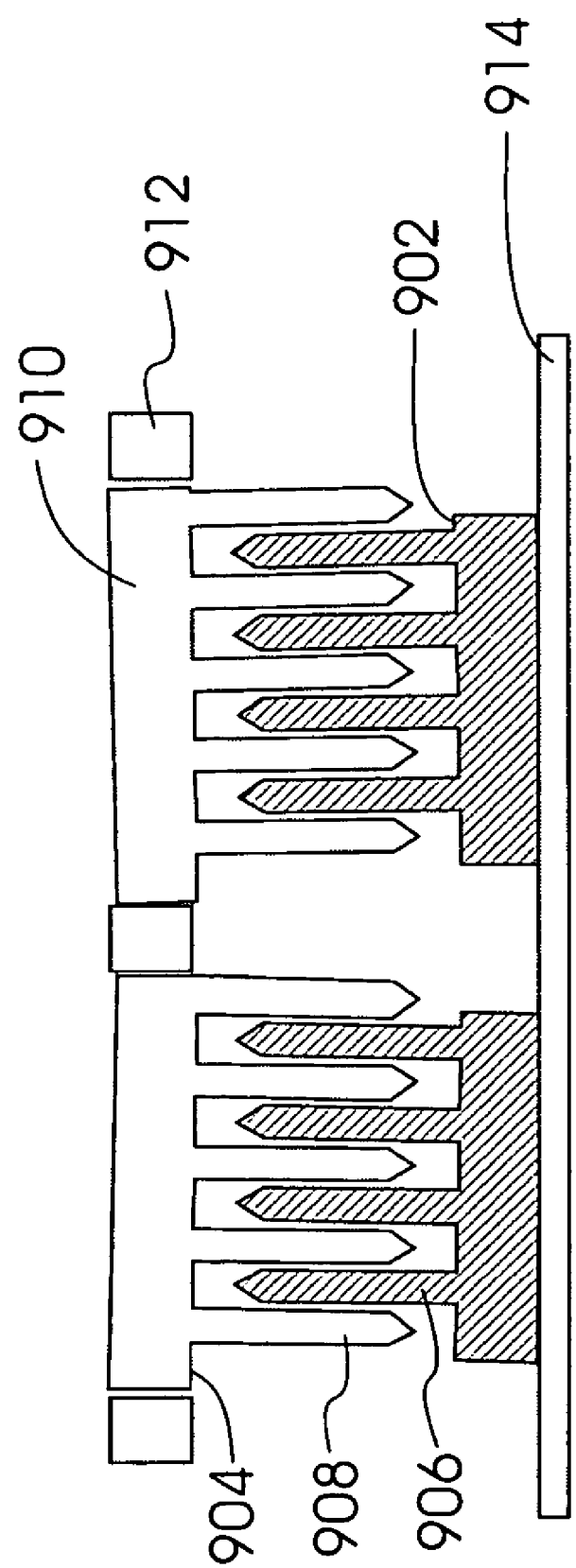
FIG. 9 is an embodiment showing multiple chip and heat-sink assemblies with interdigitated cantilever arrays arranged in the form of mobile pedestals.

FIG. 9 illustrates another embodiment of the present invention that may be used for cooling multi-chip modules (MCMs). The embodiment shows multiple chip and heat-sink assemblies arranged in the form of mobile pedestals 910. Each chip and heat-sink assembly comprises a first surface 902 (back surface of a chip), a second surface 904 (back surface of a heat sink), an array of cantilevers 906 attached to first surface 902, and an array of interlocked cantilevers 908 attached to second surface 904. The multiple mobile pedestals 910 may be arranged on a substrate 914. Mobile pedestals may be separated from each other by a cover 912. Mobile pedestals 910 have the freedom of movement with respect to outer edge surface of cover 912 and can be laterally shifted and tilted to compensate for inaccuracies in chip mounting on substrate. This embodiment provides tolerance for the placement of each chip in a multichip module (MCM).

Figure 10A:
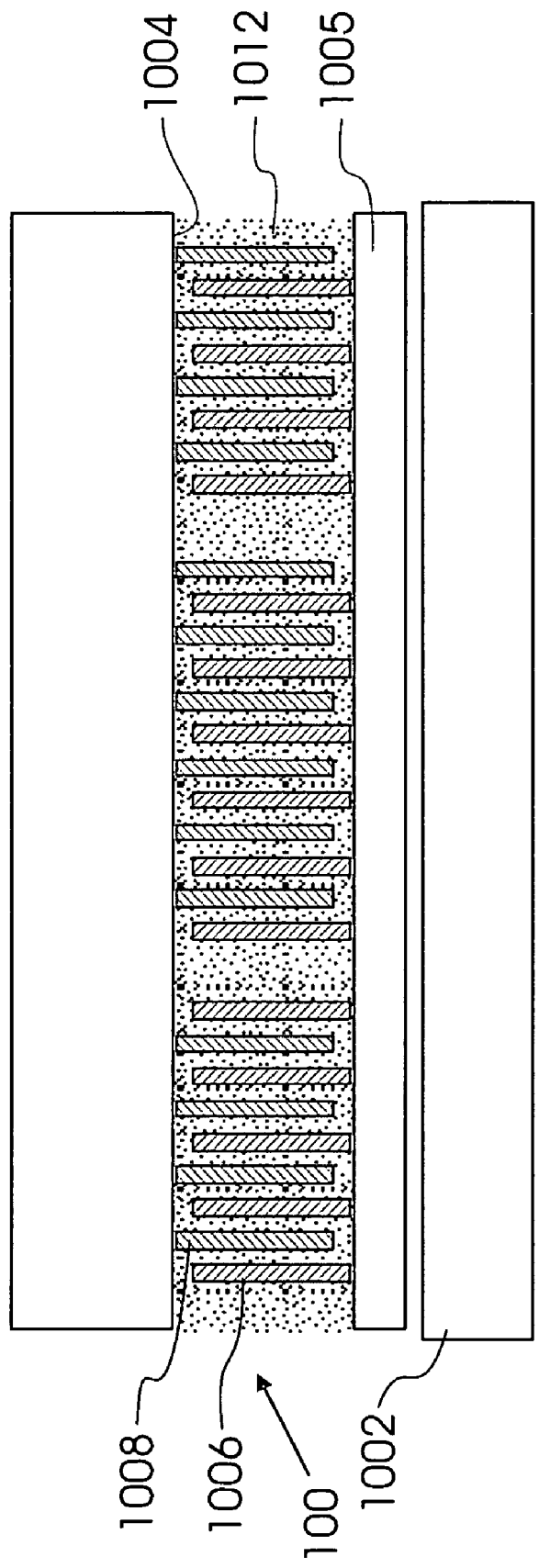
FIG. 10A illustrates a stress releasing interface, showing an array of interlocked cantilevers attached to the first surface and a thin deformable membrane that is in contact with a chip and second surfaces.

FIG. 10A illustrates another embodiment of stress releasing interface 100, comprising a first surface 1002, a second surface 1004, a thin deformable membrane 1005, an array of cantilevers 1006 attached to membrane 1005, and an array of interlocked cantilevers 1008 attached to second surface 1004. Membrane 1005 is placed above first surface 1002. Membrane 1005 adapts to the variable deformation of first surface 1002 during heat cycles. As in the embodiment of FIG. 5, the cross sections of interlocked cantilevers form multiple 8×8 repeat units of square lattices with additional gaps between any two units of square lattice. The interface further comprises cooling fluid 1012 flowing in the gaps in the interface. The additional gaps in the interface allow cooling fluid 1012 to move laterally through the interface. The lateral movement of cooling fluid 1012 helps to transport the heat away from the chip area. Thus, the presence of cooling fluid 1012 ensures a conductive thermal path from the chip to the heat sink and also ensures transport of heat to the periphery of the chip. The embodiment utilizes both conduction and convection to remove the heat from the chip area.

Figure 10B:
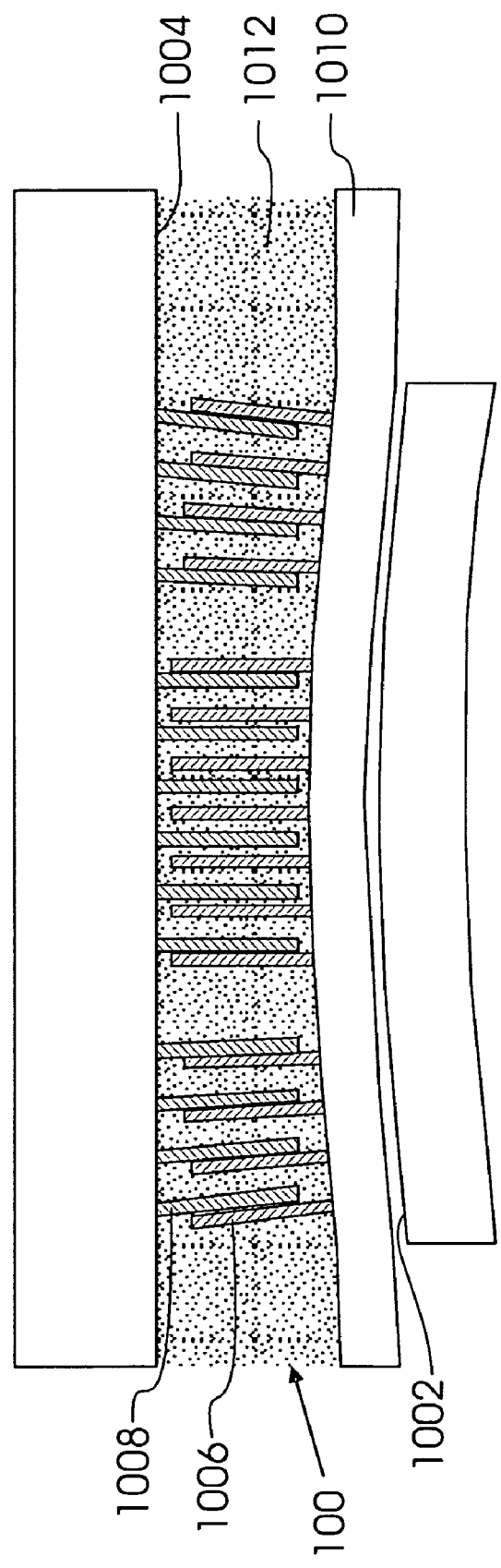
FIG. 10B shows the adaptation of the deformable membrane to a chip with a dome shaped surface.

FIG. 10B shows the adaptation of deformable membrane 1005 with a dome shaped first surface 1002. As can be seen, the interdigitated cantilevers allow for the vertical movement while maintaining the thermal contact.

FIGS. 10C and 10D illustrate embodiments similar to FIG. 10A, except that array of cantilevers 1006 is attached directly to first surface 1002. FIG. 10C shows the embodiment where interface is sealed by using seal 1014. Seal 1014 isolates cooling fluid 1012 from spilling into the zone below the chip, thereby preventing loss of cooling fluid 1012. FIG. 10D shows another embodiment of stress releasing interface 100 where a thin metal foil 1018 is bonded to the chip with a hermetic seal. In this embodiment metal foil 1018 is soldered to the first surface to provide water-proof seal at the periphery of the first surface 1002. Metal foil 1018 is elastic enough so as not to mechanically stress first surface 1002 during thermal cycles.

What is claimed is:
1. A semiconductor chip assembly, comprising:
a semiconductor chip having a back surface extending in a first lateral direction and a second lateral direction transverse to the first lateral direction;
a heat sink overlying tile back surface and spaced therefrom in a vertical direction;
a first array of flexible metal cantilevers mounted in thermal communication with the back surface of the chip, the cantilevers extending in an upward direction towards the heat sink;
a second array of flexible metal cantilevers mounted in thermal communication with the heat sink and extending in a downward direction towards the chip, the cantilevers of the first array being interdigitated with the cantilevers of the second array to transfer heat between the first and second arrays of cantilevers, wherein the cantilevers of the first and second arrays have first and second lengths in the vertical direction, respectively, and first, and second widths in the first and second lateral directions, respectively, each of the first and second lengths being much greater than the first and second widths, such that each cantilever can move independently relative to each other cantilever in the vertical and lateral directions to allow for relative vertical and lateral movement between the back surface of the chip and the heat sink such as due to differential thermal expansion between the chip and the heat sink.

2. The semiconductor chip assembly as claimed in claim 1, wherein the cantilevers have square cross-sectional shape.

3. The semiconductor chip assembly as claimed in claim 1, wherein the first and second widths of the cantilevers are uniform throughout the assembly, and the spacings between the cantilevers within the first array are uniform throughout the assembly.

4. The semiconductor chip assembly as claimed in claim 1, further comprising a thermal paste filling gaps between the cantilevers.

5. The semiconductor chip assembly as claimed in claim 4, further comprising an elastic casing sealing edges between the back surface and the heatsink, the elastic casing providing an elastic restoring force for moving outflow thermal paste back into the gaps.

6. The semiconductor chip assembly as claimed in claim 1, further comprising a deformable membrane adjacent to the heatsink, the cantilevers extending from the deformable membrane.

7. The semiconductor chip assembly as claimed in claim 1, wherein gaps between the cantilevers are filled with a cooling fluid.

8. The semiconductor chip assembly as claimed in claim 7, further comprising: at least one seal including a thin metal membrane isolating the cooling fluid from spilling into a zone below the chip.

9. The semiconductor chip assembly as claimed in claim 1, wherein the first and second widths are about 20 microns and the first and second lengths of the cantilevers are 300 microns.

10. The semiconductor chip assembly as claimed in claim 1, wherein the cantilevers have pointed tips.

11. The semiconductor chip assembly as claimed in claim 1, wherein the cross section of the cantilevers is selected from a group consisting of square, rectangular, triangular, hexagonal, octagonal, and trapezoidal.

12. The semiconductor chip assembly as claimed in claim 11, wherein the cantilevers are arranged in a circular symmetry around a center of a surface of the heatsink which faces the back surface.

13. The semiconductor chip assembly as claimed in claim 12, wherein the relative spacing and dimensions of the cantilevers are a function of the radial position of the cantilevers from the center of the first surface.

14. The semiconductor chip assembly as claimed in claim 13, wherein a width of the cantilevers is aligned along a radial direction of the assembly.

15. The semiconductor chip assembly as claimed in claim 1, wherein the cantilevers are in the form of alternating cylindrical section beams arranged in a circular symmetry around the center of the first surface.

16. The semiconductor chip assembly as claimed in claim 1, wherein at least one of the first surface and second surface has rotational freedom around the center of the first surface.

17. A method of fabricating a semiconductor chip assembly, comprising:
    interlocking a first array of flexible metal cantilevers with a second array of flexible metal cantilevers and mounting the first array of cantilevers in thermal communication with the hack surface of a chip and mounting the second array of cantilevers in thermal communication with the heatsink such that the cantilevers of the first array are interdigitated with the cantilevers of the second array to transfer heat between the first and second arrays of cantilevers,
    wherein the back surface extends in a first lateral direction and a second lateral direction transverse to the first lateral direction and the heat sink overlies the back surface and is spaced therefrom in a vertical direction, and
    wherein the cantilevers of the first and second arrays have first and second lengths in the vertical direction, respectively, and first and second widths in the first and second lateral directions, respectively, each of the first and second lengths being much greater than the first and second widths, such that each cantilever can move independently relative to each other cantilever in the vertical and lateral directions to allow for relative vertical and lateral movement between the back surface of the chip and the heat sink such as due to differential thermal expansion between the chip and the heat sink.

\* \* \* \* \*